United States Patent [19]

Hiskes et al.

[11] Patent Number: 5,198,411

[45] Date of Patent: Mar. 30, 1993

[54] CHEMICAL VAPOR PHASE METHOD FOR FORMING THIN FILMS OF HIGH TEMPERATURE OXIDE SUPERCONDUCTORS

[75] Inventors: Ronald Hiskes, Palo Alto; Martha L. Narbut, San Mateo, both of Calif.

[73] Assignee: Hewlett-Packard Company, Palo Alto, Calif.

[21] Appl. No.: 279,465

[22] Filed: Dec. 2, 1988

[51] Int. Cl.$^5$ .................. H01L 39/00; H01B 12/00
[52] U.S. Cl. .................. 505/1; 204/192.24; 437/62; 505/734
[58] Field of Search .................. 505/1, 734; 437/62, 437/255.5, 255.3; 204/192.24

[56] References Cited

U.S. PATENT DOCUMENTS

| | | | |
|---|---|---|---|
| 4,449,478 | 5/1984 | Kraus | 427/255.5 |
| 4,685,976 | 8/1987 | Schachameyer et al. | 427/53.1 |
| 4,714,594 | 12/1987 | Mircea | 427/255.5 |
| 4,814,289 | 3/1989 | Baeuerle | 427/53.1 |
| 4,828,874 | 5/1987 | Hiraoka et al. | 427/53.1 |
| 4,842,894 | 6/1989 | Ligtenberg et al. | 427/255.5 |
| 4,927,670 | 5/1990 | Erbil | 427/62 |
| 4,931,425 | 6/1990 | Kimura et al. | 505/1 |

FOREIGN PATENT DOCUMENTS

| | | |
|---|---|---|
| 3734069 | 4/1989 | Fed. Rep. of Germany . |
| 0129773 | 7/1984 | Japan .................. 427/53.1 |
| 02362151 | 11/1985 | Japan .................. 427/53.1 |
| 3257127 | 10/1988 | Japan .................. 204/192.24 |

OTHER PUBLICATIONS

Berry et al., Appl. Phys. Letts. 52 (16 May 1988) 1743.
Mantese et al., Appl. Phys. Letts. 52 (9 May 1988) 1631.
Panson et al., Appl. Phys. Letts. 53 (Oct. 1988) 1756.
Narayan et al., Appl. Phys. Letts. 51 (Nov. 1987) 1845.
Liberts et al., Appl. Phys. A 46 (Aug. 1988) 331.
Lynds et al., Mat. Res. Soc. Symp. vol. 99 (Nov. 1987) 707.
Wu et al., Appl. Phys. Letts. 54 (Jan. 1989) 180.
S. P. Denbaars, et al., "Atomic Layer Epitaxy for the Growth of Heterostructure Devices", *Journal of Crystal Growth* 93 (1988) pp. 195–200, North-Holland, Amsterdam.

*Primary Examiner*—Upendra Roy

[57] ABSTRACT

A method and apparatus are disclosed for chemically vapor depositing a thin film of an oxide based superconductor on a substrate, which is preferably a substrate comprising superconducting material. Gaseous forms of the respective reactants are first formed and then reacted together in a reaction zone adjacent a spinning substrate. In a preferred embodiment, the reactants are exposed to UV light during the reaction to catalyze the reaction.

14 Claims, 2 Drawing Sheets

CHEMICAL VAPOR PHASE METHOD FOR FORMING THIN FILMS OF HIGH TEMPERATURE OXIDE SUPERCONDUCTORS

BACKGROUND OF THE INVENTION

1. Field of the Invention

This invention relates to a method and apparatus for forming superconductor thin films. More particularly, this invention relates to a chemical vapor phase method and apparatus for growing thin films of high temperature oxide superconductors.

2. Description of the Related Art

Since the discovery of superconductivity in 1911, the phenomenon of a material being able to conduct electricity with almost no resistance when the material is cooled to a temperature approaching absolute zero (0 K) has remained an interesting scientific curiosity having few applications which would justify the expense of maintaining the necessary liquid helium cooled system.

Recently, however, superconducting ceramic materials have been produced which exhibit this phenomenon at much higher temperatures, e.g., in some cases even higher than the boiling point of liquid nitrogen which boils at about 77° K. The ability to produce superconductivity, for example, in a material cooled by liquid nitrogen completely changes the economics which have previously restricted the applications to which superconductivity could be applied.

These new ceramic materials are sometimes referred to as multi-layer perovskite compounds because of the crystallography of the resulting structure. One such group of compounds is referred to as 1-2-3 compounds because of the atomic ratios of 1 atom of an element such as a rare-earth (Lanthanum series) element, e.g., lanthanum or yttrium; 2 atoms of another element such as an alkaline earth metal, e.g., barium or strontium; and 3 atoms of a metal such as copper. The superconducting ceramic also contains from $6.5+$ to $7-$ atoms of oxygen which is usually referred to as $O_{(6.5+33)}$ where x is greater than 0 and less than 0.5, resulting in a chemical formula such as, for example, $XY_2Cu_3O_{(6.5+x)}$, where X represent the first element, e.g., a rare earth; and Y represents the second element, e.g., an alkaline earth metal.

Other ceramic compounds exhibiting such superconductivity are bismuth-strontium-calcium-copper-oxygen, thallium-calcium-barium-copper-oxygen, bismuth-lead-strontium-copper-oxygen, and thallium-calcium-barium-lead-copper-oxygen compounds. Another example of a superconducting ceramic, where copper is omitted, is a barium-potassium-bismuth-oxygen compound.

The prevalent method which has been described in the literature to produce this type of superconducting ceramic is to mechanically mix powders of the oxides or carbonates of the respective rare earth, alkaline earth metal, and copper elements in the 1-2-3 structure of the superconductor, calcine the mixture to remove water or other volatiles, and then fire the powder mixture in an oxygen atmosphere at a temperature sufficiently high to produce the desired superconducting phase.

Such methods have been adequate to form ceramic blocks or masses of superconducting material to verify the formation of superconducting materials for purposes of scientific exploration. However, for the formation of useful materials such as, for example, thin films of superconducting material for use in an integrated circuit structure, it would be desirable to form thin films of such superconductors, which might be amorphous, polycrystalline, or single crystal.

It would be desirable to produce such thin films of superconductors using a chemical vapor phase growth method and to provide an apparatus which would facilitate production of such thin films on a substrate.

SUMMARY OF THE INVENTION

It is, therefore, an object of this invention to provide a method for the growth of thin films of a superconducting material on a substrate by chemical vapor deposition.

It is another object of this invention to provide a method for the growth of thin films of a superconducting material on a substrate by chemical vapor deposition wherein halide or organometallic gases of elements capable of reacting together with oxygen to form a thin film of superconducting material are brought into contact with one another and with an oxygen-containing gas.

It is yet another object of this invention to provide a method for the growth of thin films of a superconducting material on a substrate by chemical vapor deposition wherein halide or organometallic gases of elements capable of reacting together with oxygen to form a thin film of superconducting material are brought into contact with one another and with an oxygen-containing gas adjacent to a substrate on which the resulting thin film of superconductor is deposited.

It is still another object of this invention to provide a method for the growth of thin films of a superconducting material on a substrate by chemical vapor deposition wherein halide or organometallic gases of elements capable of reacting together with oxygen to form a thin film of superconducting material are brought into contact with one another and with an oxygen-containing gas while exposing the gases to electromagnetic radiation of wavelength capable of catalyzing the reaction between the gases.

It is a further object of this invention to provide a method for the growth of thin films of a superconducting material on a substrate by chemical vapor deposition wherein halide or organometallic gases of elements capable of reacting together with oxygen to form a thin film of superconducting material are brought into contact with one another and with an oxygen-containing gas in the presence of a single crystal substrate to provide epitaxial growth of single crystal thin films of a superconducting material on an oriented substrate.

It is yet a further object of this invention to provide apparatus for the growth of thin films of a superconducting material on a substrate by chemical vapor deposition to form a thin film of superconducting material.

These and other objects of the invention will be apparent from the following description and accompanying drawings.

DETAILED DESCRIPTION OF THE INVENTION

Figure 1:
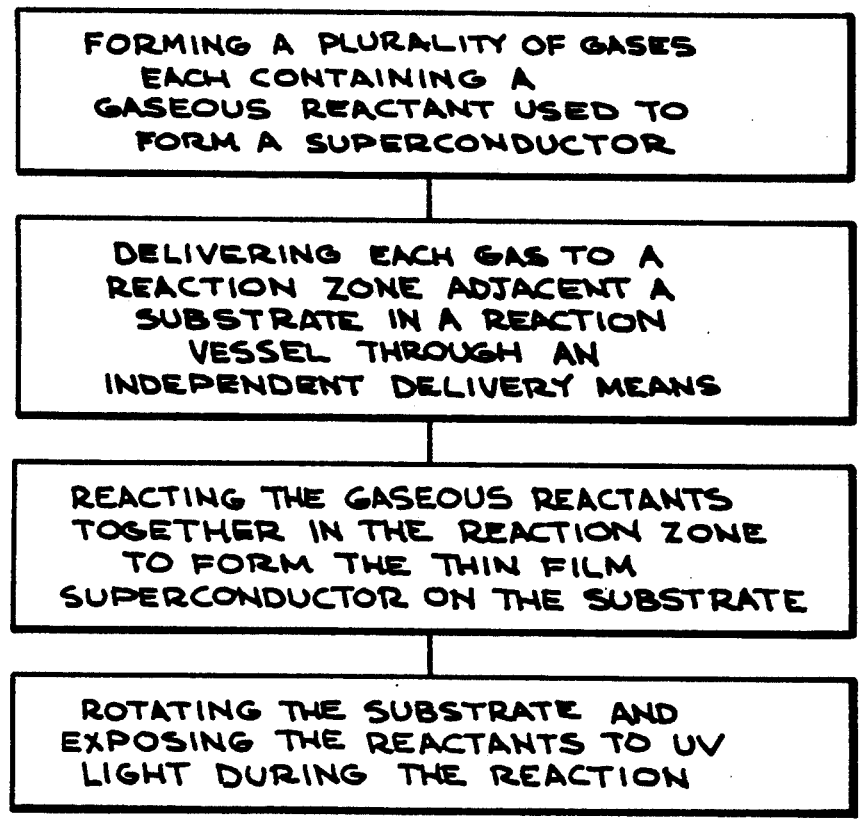
FIG. 1 is a flow sheet illustrating the process of the invention.

The invention provides a method and apparatus for producing thin films of superconducting material by chemical vapor deposition (CVD) on a substrate by the reaction, adjacent to a substrate, of gases containing the respective elements forming the thin film superconductor. In a preferred embodiment, the reaction of the gases together is catalyzed by exposure of the reactants to electromagnetic radiation of a wavelength which will promote reaction between the gases.

In one embodiment, the substrate may comprise a single crystal oriented to provide single crystal epitaxial growth of the superconductor in a direction which will favor superconducting flow along an axis of the CVD grown thin film. Most preferably, the substrate on which the superconducting thin film is grown also comprises an insulator with a low dielectric constant, i.e., below about 20°.

The gases which react to form the superconducting thin film preferably comprise halides or organometallic compounds of the elements or materials which will form the thin film of superconducting material. Typical of such compounds would be the fluorides, chlorides, bromides, iodides, acetylacetonates, heptanedionates, or other substituted betaketonates of the elements which react to form the thin film superconductor. Such compounds are used in the practice of the invention because of the volatility of the halide or organometallic compounds compared, for example, with the corresponding oxide of the same element, e.g., barium chloride or barium heptanedionate versus barium oxide.

Thus, for example, for a 1-2-3 or perovskite type superconductor structure such as the now well known superconductors $YBa_2Cu_3O_7$ or $YBa_2Cu_3O_{(6+x)}$ where $x = 0.5$ to 1; gases comprising the halides or organo compounds of yttrium, barium, and copper will be reacted with an oxygen-bearing gas to form, on an adjacent substrate, the desired superconducting thin film of $YBa_2Cu_3O(6+x)$ The gases are supplied to the reaction zone adjacent to the substrate in approximately the desired stoichiometry needed to form the desired thin film superconductor. Thus, for example, 1 mole of yttrium heptanedionate may be delivered to the reaction zone per 2 moles of barium chloride ($BaCl_2$) and 3 moles of cupric chloride ($CuCl_2$), together with a sufficient excess of oxygen to provide the desired amount of oxygen in the superconductor film, i.e., in excess of six oxygen atoms per atom of yttrium.

The above mentioned Y-Ba-Cu-O superconductors form part of the class of 1-2-3 or perovskite superconductors which may be formed into thin films in accordance with the invention and which have the general formula $RM_2CU_3O_{(6+x)}$ where $x = 0$ to 1; R is one or more rare earth elements selected from the class consisting of scandium, yttrium, and any of the lanthanide series of rare earths, including lanthanum, neodymium, promethium, samarium, europium, gadolinium, terbium, dysprosium, holmium, erbium, thulium, ytterbium, and lutetium with the possible exceptions of cerium and praseodymium which have not, to date, been successfully used in forming superconducting materials; and M is one or more alkaline earth elements selected from the class consisting of Ba, Ca, and Sr.

Examples of other superconductor thin films which may be formed in accordance with the invention include Bi-Sr-Ca-Cu-O superconductors having the formula $Bi_2Sr_2Ca_{n-1}Cu_nO_{2n+4+m}$ or $BiSr_2Ca_{n-1}Cu_nO_{2n+3+m}$ where $n = 1$ to 5 and $m = 0$ to 1; T1-Ba-Ca-Cu-O superconductors having the formula $T1_2Ba_2Ca_{n-1}Cu_nO_{2n+4+m}$ or $T1Ba_2Ca_{n-1}Cu_nO_{2n+3+m}$ where $n = 1$ to 5 and $m = 0$ to 1; and Ba-K-Bi-O superconductors having the formula $Ba_{0.6}K_{0.4}BiO_3$.

Figure 4:
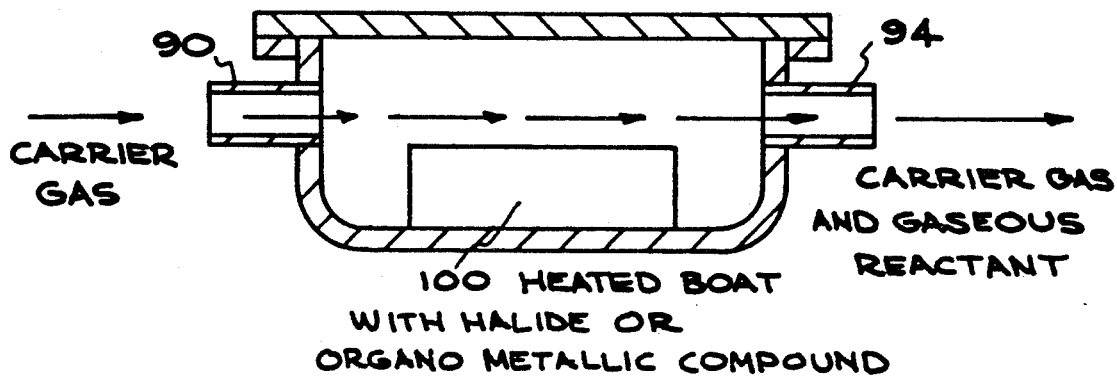
FIG. 4 is a fragmentary side section view of the apparatus which may be used to form the individual gaseous reactants.

The individual gases carrying the respective halides or organometallics of the elements or materials which will form the thin film of superconducting material may comprise a carrier gas such as argon, nitrogen, or helium or oxygen heated to a temperature above the volatilization temperature of the halide or organometallic composition to prevent condensation prior to reaction and then, as shown in FIG. 4, passed over a heated container or boat 100 having therein the halide or organometallic form of the elements or materials which will form the thin film of superconducting material.

Usually the temperature of the carrier gas containing the gaseous reactant will be maintained within a range of from about 250° to about 850° C. from when the carrier gas first contacts the solid form of the reactant until the gas arrives at the substrate where the thin film will be deposited.

While as mentioned above, oxygen may be used as one of the carrier gases as well, it is desirable that a source of oxygen be supplied to the reaction zone. The oxygen may be any source of oxygen including, by way of example, atomic oxygen, molecular oxygen, ionized oxygen, $O_3$, etc.

The substrate on which the thin film of superconductor will be formed in accordance with the invention by CVD may comprise any material capable of withstanding the operating temperature of the process. If it is desired that the thin film be a single crystal, then a single crystal substrate may be employed. In one embodiment, the substrate comprises a single crystal superconductor material such as any of the superconductor materials discussed above. Furthermore, the superconductor substrate may be the same or different from the thin film which is to be formed thereon.

An example of such a superconductor substrate used in the formation of a thin film of a different superconductor could be a $YBa_2Cu_3O_{6+n}$ substrate, where $n = 0$ to 1, when the crystal to be grown is a Bi-Sr-Ca-Cu-O crystal having the formula $Bi_2Sr_2Ca_2Cu_3O_{10}$.

In one embodiment, a seed crystal or substrate is used having a crystal orientation which will promote crystal growth in a predetermined direction wherein one or more of the axes of the epitaxially grown thin film superconductor along which superconducting current is known to flow will be grown on the substrate in the direction of intended or desired current flow along the substrate.

In another embodiment, a diffraction grating might be used as the substrate to direct the orientation of the resulting thin film growth on the substrate.

In yet another embodiment, the substrate may be a dielectric film such as MgO, $ZrO_2$, $Baf_2$, $Caf_2$, $SiO_2$, etc., which is deposited in situ on a previously deposited superconductor film by the same CVD process described herein. In this manner, heterostructures comprised of substrate/superconductor/insulator/superconductor can be fabricated in situ.

The substrate is preferably maintained at a temperature of from about 400° to about 1000° C. during deposition of the thin film thereon with the exact temperature depending upon the chemical composition of the thin film superconductor being deposited thereon. The temperature of the substrate will also control whether the deposited thin film is amorphous or crystalline in form with lower temperatures usually resulting in amorphous depositions.

Figure 2:
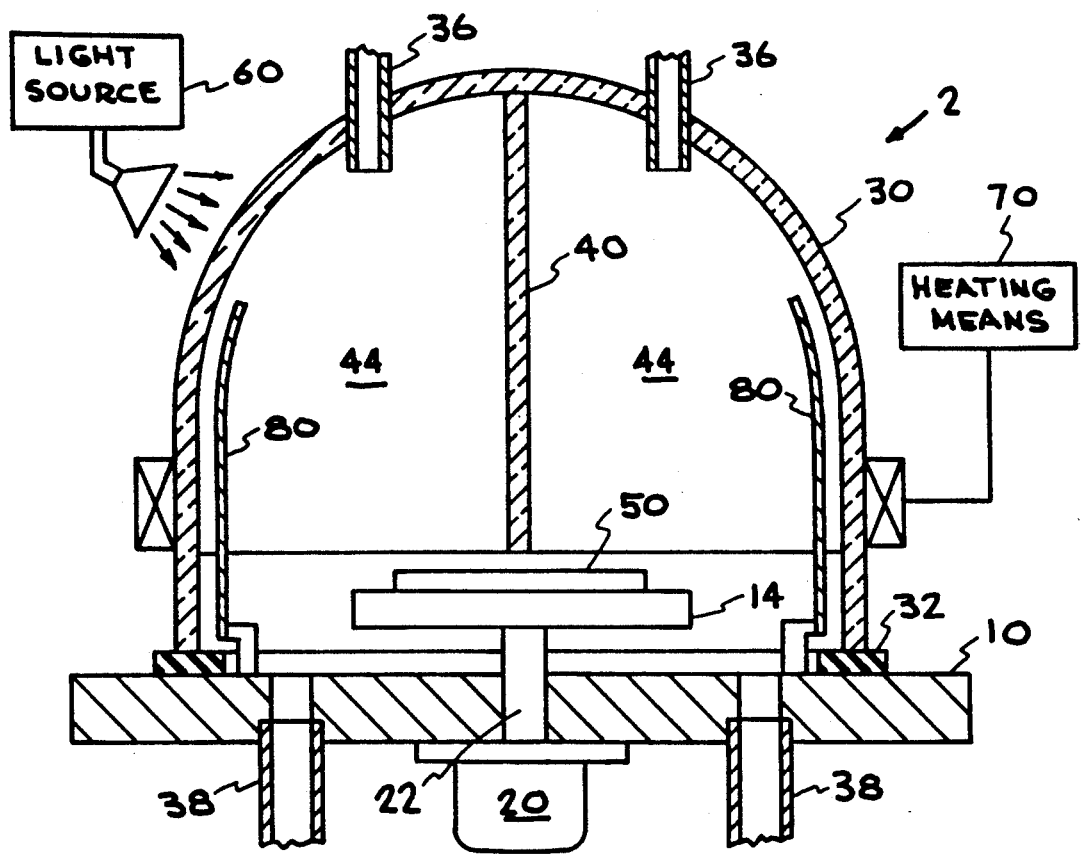
FIG. 2 is a fragmentary side section view of apparatus useful in the practice of the invention.

Turning now to FIG. 2, an apparatus useful in the practice of the invention is generally illustrated at 2 comprising a base member 10 which may comprise a metal or ceramic member capable of withstanding the operating temperatures of the process to which it will be exposed.

Removably mounted on base member 10 is a transparent quartz bell jar member 30 which may be sealed to base member 10 at 32 using conventional vacuum sealing means.

Mounted on base member 10 is a rotating turntable 14 coupled to rotation means 20 which may comprise a motor mounted beneath base member 10 and having a shaft 22 passing through an appropriate seal in base member 10. Turntable 14 functions as a rotating support for a substrate 50 which is removably affixed to the top surface of turntable 14 and upon which the thin film of superconductor will be deposited.

In accordance with the invention, during the growth of the thin film on substrate 50, turntable 14 with substrate 50 thereon, is rotated sufficiently fast to prevent buildup of any one of the reactants on the surface in preference to the desired thin film reaction product. Turntable 14 and substrate 50 are preferably rotated at a rate of from about 50 to about 1500 revolutions per minute.

While we do not wish to be bound by any particular theory of how the reaction proceeds, it is believed that the rotation of the substrate at such a rapid speed may permit the deposition thereon of any one reactant to a thickness of not more than one or a few atoms whereby subsequent deposition of atoms of the next reactant, as the substrate rotates, will cause reaction to occur between the atoms resulting in the eventual formation and buildup of only reaction product, rather than individual reactants, on the surface of the substrate.

The thickness of the thin film superconductor will be a function of the amount of time during which the reaction and thin film deposition is carried out. Usually the reaction and deposition will be carried out for a period of from about 10 seconds to about 2 hours to grow thin films ranging in thickness of from about 10 Angstroms to about 10 microns.

Figure 3:
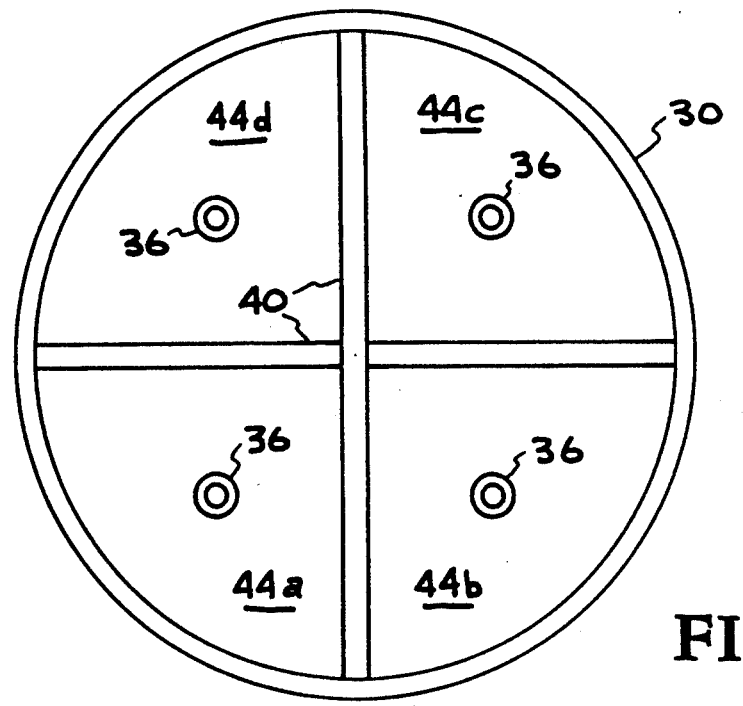
FIG. 3 is a top view of the apparatus shown in FIG. 2.

As seen in both FIGS. 2 and 3, bell jar 30 is provided with a number of entry ports or tubes 36 through which the individual gases containing the respective elements which will react together within the apparatus to form the desired thin film superconductor. By delivering each gas independently to bell jar 30, premature upstream reaction of the gases is prevented.

One or more exit ports 38 are also provided in base member 10 and attached to a vacuum source (not shown) such as a pump or other equivalent means for removing unreacted portions of the gas flowing into apparatus 2. In this regard, the pressures of the gases flowing in through entry ports 36 are regulated, relative to the exit flow, to permit a vacuum of from about 0.01 to 760 Torr to be maintained in the apparatus.

In a preferred embodiment, bell jar 30 is further provided with interior walls or partitions 40 which extend from the top of bell jar 30 down to about 1-2 millimeters above the top of the substrate, i.e., adjacent to, but above the top surface of turntable 14. Partitions 40 serve to divide bell jar 30 into a series of compartments or plenums 44. Each compartment 44 is in communication with one port 36 whereby each compartment will be filled with one gas entering therein from the respective entry port 36. The number of compartments formed in bell jar 30 will, therefore, depend upon the number of reactants which make up the particular thin film superconductor being grown.

Since each gaseous reactant is then separated from the other reactants until the gases reach the bottom of compartments 36 formed by partitions 40, the gases first come into contact with one another and thereby react together in a reaction zone which is, due to the proximity of the partitions to the substrate, adjacent to the substrate to facilitate deposition of the thin film reaction product on the substrate.

In operation then, each carrier gas is introduced into an entrance tube 90 where it then flows over a heated boat 100 containing the respective halide or organometallic compound. Each carrier gas, now carrying a halide or organometallic compound, is passed, via exit tube 94, to one of the compartments 44 through the entry port 36 in communication therewith. When each of the gas reaches the bottom of compartment 44 in bell jar 30, it may react with oxygen introduced into the region adjacent to the substrate in substantially the same manner.

These gases contact the spinning substrate and deposit a layer of material corresponding to the makeup of the gas, e.g., if copper iodide is in the gas, a layer of copper or copper oxide is deposited. The layer is immediately contacted and reacted with the gas in the next compartment as substrate 50 is rotated. This continues to be repeated as the substrate moves around 360° so that gases containing all of the constituents of the superconductor contact the substrate and the materials already deposited thereon during each rotation of the substrate. In this manner the respective reactants in the respective gases do not contact one another and prematurely react prior to reaching the surface of the substrate on which the thin film reaction product will be deposited.

In the embodiment shown in FIG. 3, bell jar 30 is divided into four compartments 44a, 44b, 44c, and 44d, thus permitting four reactant gases to be independently flowed to the reaction zone adjacent the spinning substrate 50.

Thus, for example, to grow on substrate 50 a thin film of a $YBa_2Cu_3O_{(6.5+0.5)}$ superconductor, a carrier gas containing $YCl_3$ may be flowed through compartment 44a while a carrier gas containing $BaI_2$ is flowed through compartment 44b, a carrier gas containing $CuI$ is flowed through compartment 44c, and a source of oxygen is flowed through compartment 44d.

As seen in FIG. 2, in accordance with a preferred embodiment of the invention, the reaction of the gases is preferably catalyzed by exposing the reactants to a source of electromagnetic radiation of from about 0.5 to about 400 nm, using a light source 60 mounted adjacent to bell jar 30 which may shine through the transparent walls of bell jar 30 to provide photo-excitation to catalyze the reaction. In this regard, the walls of bell jar 30 might be heated by heating means such as shown at 70 to prevent or inhibit deposition of reactants on the bell jar walls which would shield rays from light source 60 from the reaction zone or deflectors 80 might be placed within the apparatus to deflect the gas flow from the bell jar walls.

As a further illustration of the invention, a thin film superconductor of $YBa_2Cu_3O_{(6.5+x)}$ where x is greater than 0 and less than 0.5 can be grown on a $YBa_2Cu_3O_7$ substrate or support surface by flowing a first gaseous mixture of argon and yttrium tetramethylheptanedionate at a temperature of about 180° C. through a first compartment of the described apparatus, a second gaseous mixture of argon gas and barium tetramethylheptanedionate through a second compartment at a temperature of about 280° C., a third gaseous mixture of argon and CuI at about 500° C. through a third compartment, and a mixture of atomic oxygen at a temperature of about 300° C. through a fourth compartment to a substrate maintained at a temperature of about 800° C. while being spun at a speed of about 1000 rpm. At the same time, a UV light source having a wavelength of between 200-400 nm may be shone through the transparent sidewall of the reaction apparatus to catalyze the reaction which forms a thin film of $YBa_2Cu_3O_{(6.5+x)}$ on the substrate surface.

Thus, the invention provides a method for chemical vapor phase growth of a thin film of an oxide-based superconductor on a substrate while maintaining a sufficient source of oxygen present during the crystal growth.

Having thus described the invention, what is claimed is:

1. A method of forming a thin film of an oxide based superconductor by chemical vapor deposition on a substrate, without post reaction annealing in oxygen, which consists essentially of:
   (a) rotating said substrate in a deposition chamber at a speed of from about 50 to about 1500 rpm;
   (b) providing a plurality of independent reactant gas sources, each respectively comprising a gaseous form of one of the reactants of the thin film superconductor and an optional carrier gas;
   (c) independently delivering said of said reactant gases from said independent reactant gas sources to a reaction zone immediately adjacent to said rotating substrate surface through independent delivery means, including separate exit ports in said deposition chamber, in parallel gas flow directions perpendicular to the plane of said rotating substrate, to inhibit premature reaction between said gases prior to reaching said reaction zone immediately adjacent said rotating substrate surface and to permit homogeneous mixing of all of said reactant gases in said reaction zone;
   (d) reacting said independent reactant gases together in said reaction zone immediately adjacent to said rotating substrate surface; and
   (e) depositing said resulting thin film superconductor reaction product on said rotating substrate surface;
whereby buildup of any one of said reactants on said rotating substrate surface, in preference to the desired thin film of superconductor reaction product, is inhibited by said rotation of said substrate surface adjacent said exit ports of said independently delivered reactant gases.

2. The method of claim 1 wherein said step of depositing said thin film on said substrate further includes maintaining said substrate at a temperature of from about 400° to about 1000° C.

3. The method of claim 1 wherein said steps of forming said gases and delivering said gases to said reaction zone further comprise maintaining said gases at a temperature of from about 250° to about 850° C. to prevent condensation of said gases.

4. The method of claim 1 wherein said step of reacting said gases together in said reaction zone further includes exposing said gases to electromagnetic radiation during said reaction to catalyze reaction of said reactants together to form said thin film superconductor.

5. The method of claim 1 wherein said step of depositing said thin film on said substrate further includes depositing said thin film on a superconductor substrate.

6. The method of claim 1 wherein said step of depositing said thin film on said substrate further includes depositing said thin film on a dielectric substrate.

7. The method of claim 4 wherein said electromagnetic radiation has a wavelength range of from about 0.5 to about 400 nm.

8. A method of forming a thin film of an oxide based superconductor reaction product by chemical vapor deposition on a substrate in a deposition chamber, without post reaction annealing in oxygen, which consists essentially of:
   (a) rotating said substrate at a speed of from about 50 to about 1500 rpm in said deposition chamber;
   (b) providing a plurality of independent reactant gas sources, each respectively comprising a gaseous form of one of the reactants of the thin film superconductor and an optional carrier gas;
   (c) maintaining each of said gases at a temperature of from about 250° to about 850° C. to prevent condensation of said gases;
   (d) independently delivering each of said reactant gases from said independent reactant gas sources to a reaction zone immediately adjacent to the surface of said rotating substrate respectively through independent delivery means, in parallel gas flow directions perpendicular to the plane of said rotating substrate, each of said independent delivery means having an exit port immediately adjacent the surface of said rotating substrate to inhibit premature reaction between said reactant gases prior to reaching said reaction zone and to permit homogeneous mixing of all of said reactant gases in said reaction zone;
   (e) reacting said reactant gases together in said reaction zone adjacent to the surface of said rotating substrate while maintaining said substrate at a temperature of from about 400° to about 1000° C.;
   (f) exposing said reactant gases in said reaction zone to electromagnetic radiation of from 0.5 to 400 nm during said reaction to catalyze said reaction to form said superconductor reaction product; and
   (g) depositing said resulting thin film superconductor reaction product on the surface of said rotating substrate.

9. The process of claim 8 wherein said step of forming said gases further includes forming at least a portion of said gases from halides of elements capable of reacting together to form a superconductor selected from the class consisting of scandium, yttrium, lanthanum, neodymium, promethium, samarium, europium, gadolinium, terbium, dysprosium, holmium, erbium, thulium, ytterbium, lutetium, barium, calcium, strontium, potassium, lead, bismuth, thallium, and copper.

10. The process of claim 8 wherein said step of forming said gases further includes forming at least a portion of said gases from organometallic compounds containing elements capable of reacting together to form a superconductor selected from the class consisting of scandium, yttrium, lanthanum, neodymium, promethium, samarium, europium, gadolinium, terbium, dysprosium, holmium, erbium, thulium, ytterbium, lutetium, barium, calcium, strontium, potassium, lead, bismuth, thallium, and copper.

11. A method of forming a thin film of an oxide based superconductor by chemical vapor deposition on a dielectric thin film substrate which is itself deposited on another superconducting material, without post reaction annealing in oxygen, which consists essentially of:
   (a) rotating said substrate in a deposition chamber at a speed of from about 50 to about 1500 rpm;
   (b) providing a plurality of independent reactant gas sources, each reactant gas source respectively comprising a gaseous form of one of the reactants of the thin film superconductor and an optional carrier gas;
   (c) independently delivering each of said reactant gases from said independent reactant gas sources to a reaction zone immediately adjacent to said rotating substrate surface through independent delivery means, including separate exit ports in said deposition chamber, in parallel gas flow directions perpendicular to the plane of said rotating substrate, to inhibit premature reaction between said gases prior to reaching said reaction zone immediately adjacent to said rotating substrate surface and to permit homogeneous mixing of all of said reactant gases in said reaction zone;
   (d) reacting said independent reactant gases together in said reaction zone immediately adjacent said rotating substrate surface; and
   (e) depositing said resulting thin film superconductor reaction product on said rotating substrate surface of said dielectric thin film substrate deposited on another superconductor material;
whereby buildup of any one of said reactants on said rotating substrate surface, in preference to the desired thin film of superconductor reaction product, is inhibited by said rotation of said substrate surface adjacent said exit ports of said independently delivered reactant gases.

12. The method of claim 11 wherein said step of depositing said thin film on said substrate further includes depositing said thin film on a dielectric thin film which is itself deposited on another superconducting film previously deposited on said substrate.

13. A method of forming a thin film of an oxide based superconductor by chemical vapor deposition on a single crystal superconductor substrate, without post reaction annealing in oxygen, which consists essentially of:
   (a) rotating said substrate in a deposition chamber at a speed of from about 50 to about 1500 rpm;
   (b) providing a plurality of independent reactant gas sources, each reactant gas source respectively comprising a gaseous form of one of the reactants of the thin film superconductor and an optional carrier gas;
   (c) independently delivery each of said reactant gases from said independent reactant gas sources to a reaction zone immediately adjacent to said rotating substrate surface through independent delivery means, including separate exit ports in said deposition chamber, in parallel gas flow directions perpendicular to the plane of said rotating substrate, to inhibit premature reaction between said gases prior to reaching said reaction zone immediately adjacent to said rotating substrate surface and to permit homogeneous mixing of all of said reactant gases in said reaction zone;
   (d) reacting said independent reactant gases together in said reaction zone immediately adjacent said rotating substrate surface; and
   (e) depositing said resulting thin film superconductor reaction product on said rotating substrate surface of said single crystal superconductor;
whereby buildup of any one of said reactants on said rotating substrate surface, in preference to the desired thin film of superconductor reaction product, is inhibited by said rotation of said substrate surface adjacent said exit ports of said independently delivered reactant gases.

14. A method of forming a thin film of an oxide based superconductor by chemical vapor deposition on a diffraction grating substrate, without post reaction annealing in oxygen, which consists essentially of:
   (a) rotating said substrate in a deposition chamber at a speed of from about 50 to about 1500 rpm;
   (b) providing a plurality of independently reactant gas sources, each reactant gas source respectively comprising a gaseous form of one of the reactants of the thin film superconductor and an optional carrier gas;
   (c) independently delivering each of said reactant gases from said independent reactant gas sources to a reaction zone immediately adjacent to said rotating substrate surface through independent delivery means, including separate exit ports in said deposition chamber, in parallel gas flow directions perpendicular to the plane of said rotating substrate, to inhibit premature reaction between said gases prior to reaching said reaction zone immediately adjacent to said rotating substrate surface and to permit homogeneous mixing of all of said reactant gases in said reaction zone;
   (d) reacting said independent reactant gases together in said reaction zone immediately adjacent said rotating substrate surface; and
   (e) depositing said resulting thin film superconductor reaction product on said rotating substrate surface of said diffraction grating substrate;
whereby buildup of any one of said reactants on said rotating substrate surface, in preference to the desired thin film of superconductor reaction product, is inhibited by said rotation of said substrate surface adjacent said exit ports of said independently delivered reactant gases.

* * * * *

UNITED STATES PATENT AND TRADEMARK OFFICE
CERTIFICATE OF CORRECTION

PATENT NO. : 5,198,411
DATED : Mar. 30, 1993
INVENTOR(S) : Ronald Hiskes, Martha L. Narbut It is certified that error appears in the above-identified patent and that said Letters Patent is hereby corrected as shown below:

Column 1, Line 40, change "$O_{(6.5+33)}$" to --$O_{(6.5+x)}$--;

Column 3, Line 45, change "$YBa_2Cu_3O(6+x)$" to --$YBa_2Cu_3O_{(6+x)}$--;

Column 4, Line 63, change "$Baf_2, Caf_2$" to --$BaF_2, CaF_2$--;

Column 7, Line 44, change "said" to --each--;

Column 10, Line 3, change "delivery" to --delivering--.

Signed and Sealed this

Fifth Day of April, 1994

*Attest:*

BRUCE LEHMAN

*Attesting Officer*    *Commissioner of Patents and Trademarks*